(12) United States Patent
Noh

(10) Patent No.: US 8,792,290 B2
(45) Date of Patent: Jul. 29, 2014

(54) VOLTAGE GENERATOR AND NONVOLATILE MEMORY DEVICE INCLUDING THE SAME

(75) Inventor: Yu Jong Noh, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 266 days.

(21) Appl. No.: 13/338,999

(22) Filed: Dec. 28, 2011

(65) Prior Publication Data

US 2012/0169407 A1    Jul. 5, 2012

(30) Foreign Application Priority Data

Dec. 30, 2010    (KR) .................. 10-2010-0139184

(51) Int. Cl.
    *G11C 7/00*     (2006.01)

(52) U.S. Cl.
    CPC ........................... *G11C 7/11* (2013.01)
    USPC .................. 365/189.19; 365/189.11

(58) Field of Classification Search
    CPC .................... G11C 7/22; G11C 7/222
    USPC ........ 365/189.09, 189.11; 327/536, 535, 534, 327/537
    See application file for complete search history.

(56) References Cited

U.S. PATENT DOCUMENTS

| | | | | |
|---|---|---|---|---|
| 5,959,854 | A | * | 9/1999 | Okada .............................. 363/60 |
| 7,940,117 | B2 | * | 5/2011 | Jeon .............................. 327/535 |
| 2005/0218966 | A1 | * | 10/2005 | Azuma et al. .................. 327/536 |

FOREIGN PATENT DOCUMENTS

| | | |
|---|---|---|
| KR | 10-1998-071820 A | 10/1998 |
| KR | 1020060135234 A | 12/2006 |

* cited by examiner

*Primary Examiner* — Vu Le
(74) *Attorney, Agent, or Firm* — William Park & Associates Patent Ltd.

(57) ABSTRACT

A voltage generator includes a high voltage generator configured to include a plurality of pump circuits for generating various levels of a high voltage in response to clock signals, wherein the plurality of pump circuits are configured to receive enable signals corresponding to a level of voltage to be generated, where the enable signals are generated in response to internal operation signals. And a clock transfer circuit configured to generate a clock enable signal by comparing the high voltage and a reference voltage and to selectively provide the clock signals to each of the pump circuits in response to the clock enable signal and each of the enable signals.

20 Claims, 5 Drawing Sheets

VOLTAGE GENERATOR AND NONVOLATILE MEMORY DEVICE INCLUDING THE SAME

CROSS-REFERENCE TO RELATED APPLICATION

The present application claims priority under 35 U.S.C 119(a) to Korean patent application number 10-2010-0139184 filed on Dec. 30, 2010, the entire disclosure of which is incorporated by reference herein.

BACKGROUND

1. Field of the Invention

Example embodiments relate to a voltage generator and a nonvolatile memory device including the same and, more particularly, to a voltage generator including pump circuits.

2. Description of the Related Art

A nonvolatile memory device includes a memory cell array for storing data and a variety of circuits for storing data in the memory cell array or for reading data stored in the memory cell array. The circuits may include a controller for generating various control signals, a voltage generator for generating voltages necessary for a program, read, or erase operation in response to the control signals of the controller, a row decoder for selecting one of a plurality of cell blocks included in the memory cell array and transferring the voltages from the voltage generator to the selected cell block, a column selector for selecting a column in response to the control signals of the controller, and a page buffer group.

The voltage generator generates voltages necessary for the program, read, or erase operation and transfers the voltages to the row decoder. In particular, in the case of the program operation, the voltage generator requires a plurality of pump circuits for generating high voltages because the high voltages of 15 V to 30 V are required. Furthermore, not only the high voltages, but also low voltages are required because various levels of voltages are required according to the operation in the semiconductor device.

As described above, the various levels of voltages are generated by the voltage generator. The voltage generator drives all the pump circuits for generating the high voltage in response to clock signals generated by an oscillator. However, even when the low voltage is generated, all the pump circuits are operated in response to the clock signals, leading to unnecessary current consumption.

BRIEF SUMMARY

Embodiments relate to the prevention of unnecessary power consumption occurring when a low voltage is generated by selectively operating pump circuits.

A voltage generator according to an aspect of the present disclosure includes a high voltage generator configured to include a plurality of pump circuits for generating various levels of a high voltage in response to clock signals, wherein the plurality of pump circuits are configured to receive enable signals corresponding to a level of voltage to be generated where the enable signals are generated in response to internal operation signals. The voltage generator further includes a clock transfer circuit configured to generate a clock enable signal by comparing the high voltage and a reference voltage and to selectively provide the clock signals to each of the pump circuits in response to the clock enable signal and each of the enable signals.

A nonvolatile memory device according to another aspect of the present disclosure includes an oscillator configured to generate clock signals, a high voltage generator configured to include a plurality of pump circuits for generating various levels of a high voltage by performing pumping operations in response to clock signals, a first decoder configured to generate enable signals for operating the number of pump circuits corresponding to a level of voltage to be generated, from among the pump circuits, in response to the internal operation signals corresponding to a program, read or erase operation, a clock transfer circuit configured to selectively provide the clock signals to each of the pump circuits in response to each of the enable signals, a second decoder configured to generate selection signals in response to the respective enable signals, and a high voltage switch circuit configured to transfer the high voltage of the high voltage generator to an internal circuit in response to the selection signals.

A voltage generator according to yet another aspect of the present disclosure includes a first decoder configured to generate a plurality of enable signals, and activate a number of enable signals determined based on a set high voltage, a clock transfer circuit configured to generate a same number of clock signals as the number of activated enable signals, and a high voltage generator configured to comprise a plurality of pump circuits for generating various levels of a high voltage in response to the clock signals. The number of pump circuits operated is identical with the number of clock signals generated by the clock transfer circuit.

DESCRIPTION OF EMBODIMENTS

Hereinafter, embodiments of the present disclosure will be described in detail with reference to the accompanying drawings. The figures are provided to allow those having ordinary skill in the art to understand the scope of embodiments of the disclosure.

Figure 1:
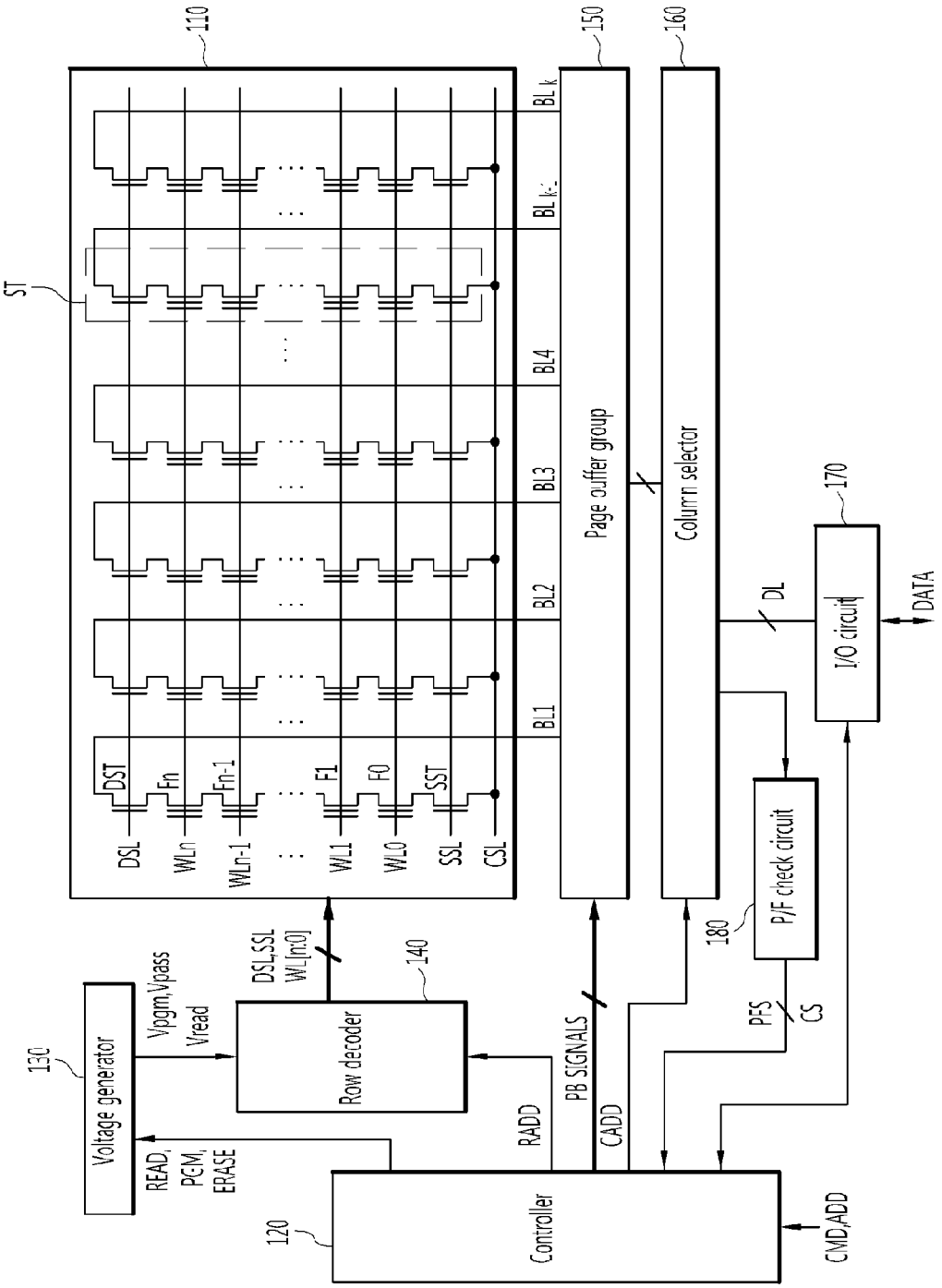
FIG. 1 is a block diagram of a nonvolatile memory device according to this disclosure.

FIG. 1 is a block diagram of a nonvolatile memory device according to this disclosure.

Referring to FIG. 1, the nonvolatile memory device includes a memory cell array 110, a circuit group (130, 140, 150, 160, 170, and 180) for performing a program operation or a read operation on the memory cells of the memory cell array 110, and a controller 120 for controlling the circuit group (130, 140, 150, 160, 170, and 180) in order to set threshold voltages of selected memory cells based on received data.

In the case of a NAND flash memory device, the circuit group includes a voltage generator 130, a row decoder 140, a page buffer group 150, a column selector 160, an I/O circuit 170, and a pass/fail (P/F) check circuit 180.

The memory cell array 110 includes a plurality of memory cell blocks. Only one of the memory cell blocks is shown in FIG. 1. Each memory cell block includes a plurality of strings ST. Some of the strings ST are designated as normal strings, and some of them are designated as flag strings. The strings ST have the same construction. Each string ST includes a source select transistor SST coupled to a common source line CSL, a plurality of memory cells F0 to Fn, and a drain select transistor DST coupled to a bit line BL. Memory cells included in the flag string are called flag cells, but the flag cells have the same construction as memory cells included in the normal string. A gate of the source select transistor SST is coupled to a source select line SSL. Gates of the memory cells F0 to Fn are coupled to respective word lines WL0 to WLn. A gate of the drain select transistor DST is coupled to a drain select line DSL. The strings ST are coupled to respective bit lines BL1 to BLk and are in common coupled to the common source line CSL.

The controller 120 internally generates a program operation signal PGM, a read operation signal READ, or an erase operation signal ERASE in response to a command signal CMD. The controller may also generate page buffer signals PB SIGNALS for controlling the page buffers (not shown) of the page buffer group 150 according to a type of the operation. Furthermore, the controller 120 internally generates a row address signal RADD and a column address signal CADD in response to an address signal ADD. Furthermore, the controller 120 checks whether the threshold voltages of selected memory cells have risen to a target voltage during a program verification operation. The controller 120 may check the threshold voltages of selected memory cells in response to a check signal PFS. The check signal PFS may be generated from the P/F check circuit 180. The controller 120 may determine whether to perform a program operation again according to a result of the check.

A voltage supply circuit (130, 140) supplies operating voltages necessary for the program operation, the erase operation, and the read operation of memory cells. The voltage supply circuit (130, 140) may supply the operating voltages to the drain select line DSL, the word lines WL0 to WLn, and the source select line SSL of a selected memory cell block in response to the signals READ, PGM, ERASE, and RADD received from the controller 120. The voltage supply circuit includes the voltage generator 130 and the row decoder 140.

The voltage generator 130 outputs the operating voltages for programming, reading, or erasing memory cells to global lines in response to internal command signals (that is, PGM, READ, or ERASE) received from the controller 120, and the voltage generator 130 outputs operating voltages (for example, Vpgm, Vpass, and Vread) to the global lines where the operating voltages may be used to program the memory cells.

The row decoder 140 may receive operating voltages from the voltage generator 130 and transfer the operating voltages to the local lines DSL, WL[n:0], and SSL of a selected memory cell block. The row decoder may transfer the operating voltages in response to the row address signals RADD received from the controller 120.

The page buffer group 150 includes page buffers that may be coupled to the respective bit lines BL1 to BLk. The page buffer group 150 supplies voltages necessary to store data in the memory cells F0 to Fn to the respective bit lines BL1 to BLk in response to the page buffer signals PB SIGNALS received from the controller 120. More particularly, the page buffer group 150 precharges the bit lines BL1 to BLk or latches data corresponding to the threshold voltages of the memory cells F0 to Fn, detected according to a shift in the voltages of the bit lines BL1 to BLk. The shift in the voltages of the bit lines BL1 to BLK may occur when the program operation, the erase operation, or the read operation of the memory cells F0 to Fn is performed. That is, the page buffer group 150 supplies a program permission voltage (for example, 0 V) or a program inhibition voltage (for example, Vcc) to the bit lines based on data latched in latches when a program operation is performed. The page buffer group 150 may also detect data stored in the memory cells F0 to Fn by controlling the voltages of the bit lines BL1 to BLk based on the data stored in the memory cells F0 to Fn when a read operation is performed.

The column selector 160 selects the page buffers of the page buffer group 150 in response to the column address signal CADD received from the controller 120. Data latched in a page buffer selected by the column selector 160 is outputted.

The I/O circuit 170 transfers external data DATA to the column selector 160 under control of the controller 120 so that the data DATA is inputted to the page buffers of the page buffer group 150 when a program operation is performed. When the column selector 160 sequentially transfers the data DATA to the page buffers of the page buffer group 150, the page buffers store the received data DATA in their latches. When a read operation is performed, the I/O circuit 170 externally outputs data DATA received from the page buffers of the page buffer group 150 via the column selector 160.

The P/F check circuit 180 checks whether there is an error cell from among programmed memory cells having a threshold voltage lower than a target voltage. The check for whether an error cell does not meet a target voltage may be performed as part of a program verification operation that may be performed after a program operation. The P/F check circuit may output a result of the check as the check signal PFC. Furthermore, the P/F check circuit 180 counts the number of error cells having a threshold lower than a target voltage and outputs a result of the count as a count signal CS.

The controller 120 controls the level of a program voltage supplied to a selected word line when a program operation is performed on memory cells coupled to the selected word line. The controller 120 may control the voltage generator 130 when a program verification operation is performed such that verification voltages are selectively supplied to a selected word line. Here, the controller 120 may control the voltage generator 130 in response to the check signal PFS of the P/F check circuit 180.

The voltage generator 130 is described in more detail below.

Figure 2:
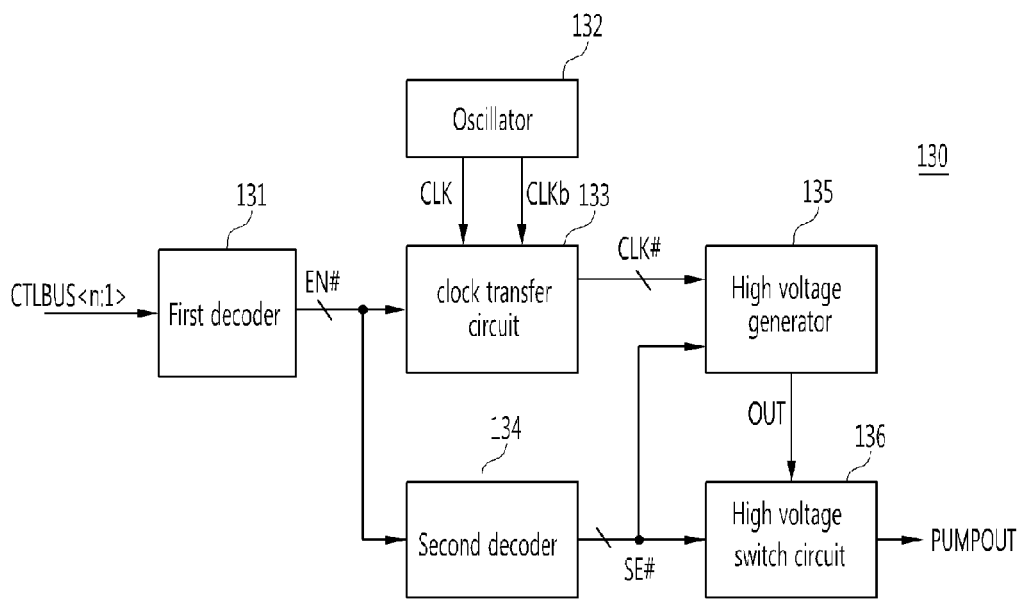
FIG. 2 is a detailed block diagram of a voltage generator shown in FIG. 1.

FIG. 2 is a detailed block diagram of the voltage generator 130 shown in FIG. 1.

Referring to FIG. 2, the voltage generator 130 includes a first decoder 131, an oscillator 132, a clock transfer circuit 133, a second decoder 134, a high voltage generator 135, and a high voltage switch circuit 136.

The first decoder (or a high voltage decoder) 131 generates enable signals EN# for selectively operating first to $n^{th}$ pump circuits (refer to FIG. 7), included in the high voltage generator 135, by decoding internal operation signals CTLBUS<n:1> generated from the controller 120. The enable signals EN# may be transferred to the clock transfer circuit 133. Clock drivers D1 to Dn (refer to FIG. 4), included in the clock transfer circuit 133, selectively generate the clock signals CLK# (that is, CLK and CLKb) of the oscillator 132 in response to the enable signals EN#.

That is, the clock drivers D1 to Dn of the clock transfer circuit 133 are selectively driven in response to the enable signals EN# of the first decoder 131. The pump circuits of the high voltage generator 135 are selectively driven in response to the clock signals CLK and CLKb outputted by selected clock drivers. In response to the enable signals EN# of the first decoder 131, the second decoder 134 generates selection signals SE#. The selection signals SE# may be used for selecting switches for outputting high voltages of the high voltage generator 135 to internal circuits.

Accordingly, the high voltage generator 135 generates a high voltage OUT in response to the clock signals CLK# (that is, CLK and CLKb) and the selection signals SE# of the second decoder 134 and outputs the high voltage PUMPOUT.

The high voltage switch circuit 136 selects the switches in response to the selection signals SE# and transfers the high voltage OUT to the internal circuits. Accordingly, the high voltage OUT generated by the high voltage generator 135 and a high voltage PUMPOUT generated by the high voltage switch circuit 136 have the same level.

Each of the elements shown in FIG. 2 is described in detail with reference to the accompanying drawings.

Figure 3:
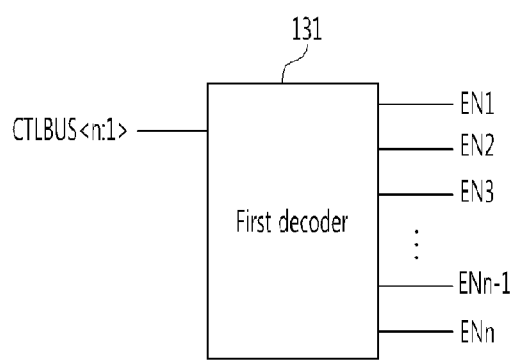
FIG. 3 is a block diagram of a first decoder shown in FIG. 2.

FIG. 3 is a block diagram of the first decoder 131 shown in FIG. 2.

Referring to FIG. 3, the first decoder 131 generates the enable signals EN1 to ENn for selectively driving the pump circuits (refer to FIG. 7) by decoding the internal operation signals CTLBUS<n:1> outputted from the controller 120.

More particularly, the controller 120 generates the internal operation signals CTLBUS<n:1>, including signals related to voltages necessary for a program operation, a read operation, or an erase operation, in response to the command signal CMD and the address signal ADD. In response to the internal operation signals CTLBUS<n:1>, the first decoder 131 generates the enable signals EN# for determining the number of pump circuits which are necessary to generate an operating voltage necessary for a relevant operation.

For example, where five pump circuits must be driven in order to generate voltage of 5 V in a program operation, the first decoder 131 may generate the first to fifth enable signals EN1 to EN5 of a high level and the remaining sixth to $n^{th}$ enable signals EN6 to ENn of a low level in response. In another example, where three pump circuits must be driven in order to generate voltage of 3 V in a read operation, the first decoder 131 may generate the first to third enable signal EN1 to EN3 of a high level and the remaining fourth to $n^{th}$ enable signals EN4 to ENn of a low. As described above, the first decoder 131 generates only the enable signals EN# of a high level in order to drive only the pump circuits necessary to generate a high voltage of a desired level.

Figure 4:
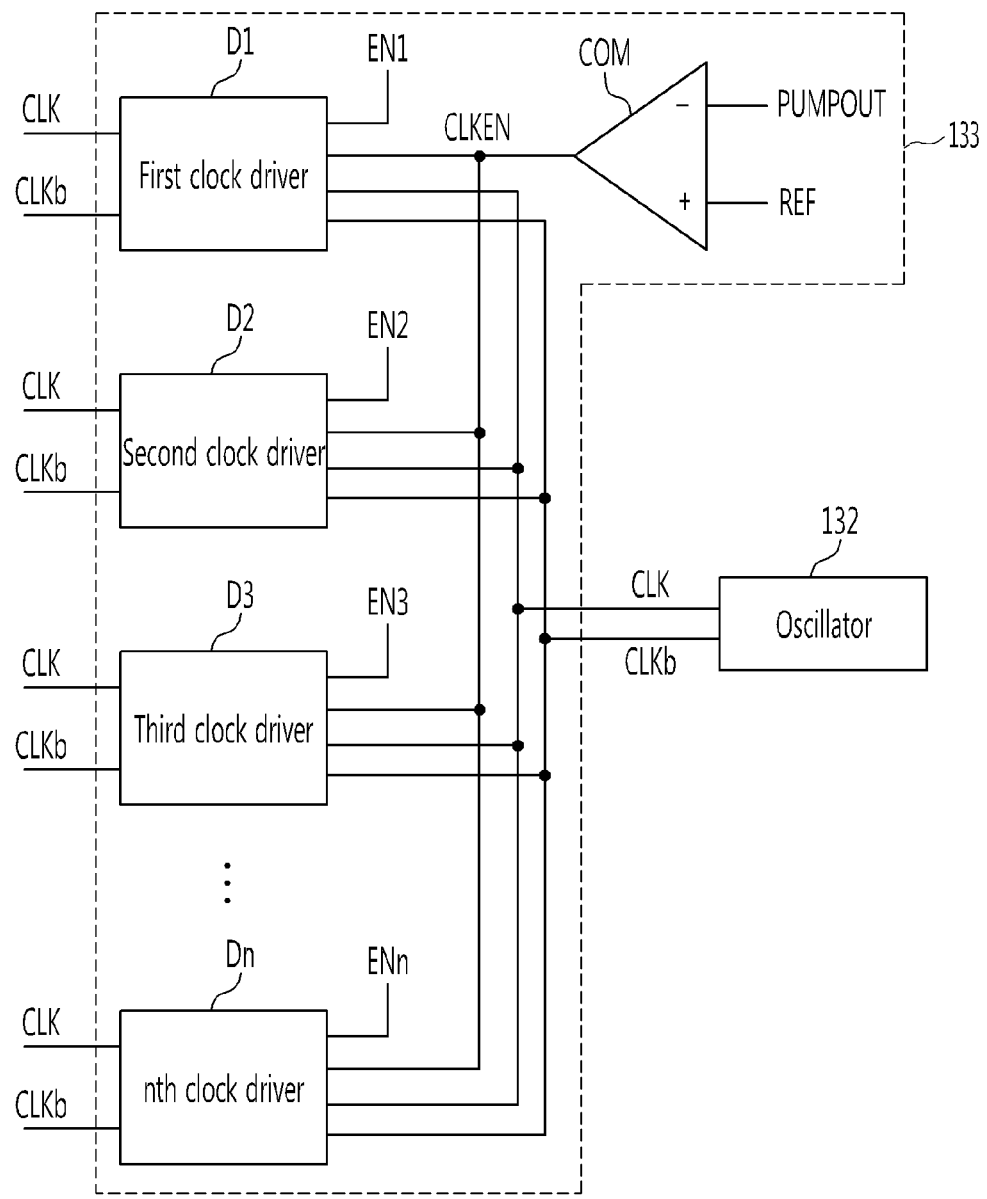
FIG. 4 is a detailed circuit diagram of a clock transfer circuit shown in FIG. 2.

FIG. 4 is a detailed circuit diagram of the clock transfer circuit 133 shown in FIG. 2.

Referring to FIG. 4, the clock transfer circuit 133 includes a comparator COM and the plurality of clock drivers D1 to Dn.

The comparator COM compares a reference voltage REF and the high voltage PUMPOUT of the high voltage switch circuit 136 and generates a clock enable signal CLKEN according to a result of the comparison. For example, when the high voltage PUMPOUT is higher than the reference voltage REF, the comparator COM generates the clock enable signal CLKEN of a low level. When the high voltage PUMPOUT is lower than the reference voltage REF, the comparator COM generates the clock enable signal CLKEN of a high level. That is, if the high voltage PUMPOUT of the high voltage switch circuit 136 is too high, the comparator COM functions as a regulator for stopping a pumping operation by deactivating the clock drivers.

Each of the clock drivers D1 to Dn outputs the clock signals CLK and CLKb, received from the oscillator 132, in response to the clock enable signal CLKEN and each of the respective enable signals EN1 to ENn. Although oscillators corresponding to the respective clock drivers D1 to Dn may be used, the volume of the circuit can be greatly increased. Accordingly, it is preferred that only the oscillator 132 be used and the clock signals CLK and CLKb generated by the oscillator 132 be transferred to each of the clock drivers D1 to Dn.

Each of the clock drivers D1 to Dn is activated only when both the clock enable signal CLKEN and each of the respective enable signals EN1 to ENn are in a high level and is configured to output the clock signals CLK and CLKb. The clock driver is described in more detail below with reference to FIG. 5.

Figure 5:
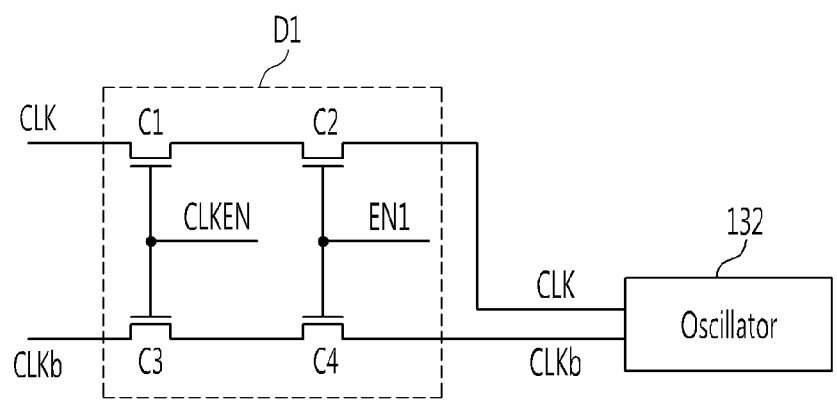
FIG. 5 is a detailed circuit diagram of a clock driver shown in FIG. 4.

FIG. 5 is a detailed circuit diagram of the clock driver shown in FIG. 4.

The clock drivers D1 to D2 have the same construction, and only the first clock driver D1 is described as an example.

The first clock driver D1 includes first to fourth switches C1 to C4 operated in response to the first enable signal EN1 and the clock enable signal CLKEN. The first and the second switches C1 and C2 are coupled in series, and the third and the fourth switches C3 and C4 are coupled in series. The second switch C2 transfers the clock CLK of the oscillator 132 to the first switch C1 in response to the first enable signal EN1, and the first switch C1 outputs the received clock CLK in response to the clock enable signal CLKEN. The fourth switch C4 transfers the inverse clock signal CLKb of the oscillator 132 to the third switch C3 in response to the first enable signal EN1, and the third switch C3 outputs the received inverse clock signal CLKb in response to the clock enable signal CLKEN. The inverse clock signal CLKb has an opposite phase to the clock signal CLK. Each of the first to the fourth switches C1 to C4 is implemented using an NMOS transistor.

Referring back to FIGS. 4 and 5, like the first clock driver D1, each of the clock drivers D2 to Dn outputs the clock signals CLK and CLKb of the oscillator 132 in response to the clock enable signal CLKEN and each of the respective enable signals EN2 to ENn.

Furthermore, each of the clock drivers D1 to Dn is activated only when both the clock enable signal CLKEN and each of the respective enable signals EN2 to ENn are in a high level and is configured to output the clock signals CLK and CLKb. If any one of the clock enable signal CLKEN and each of the enable signals EN# and is received in a low level, a relevant clock driver is deactivated, thus not outputting the clock signals CLK and CLKb. For example, when both the clock enable signal CLKEN and the first and the second enable signals EN1 and EN2 are in a high level and the third to $n^{th}$ enable signals EN3 to ENn are in a low level, only the first and the second clock drivers D1 and D2 are activated, thus each outputting the clock signals CLK and CLKb. The remaining third to $n^{th}$ clock drivers D3 to Dn are deactivated, thus not outputting the clock signals CLK and CLKb.

Figure 6:
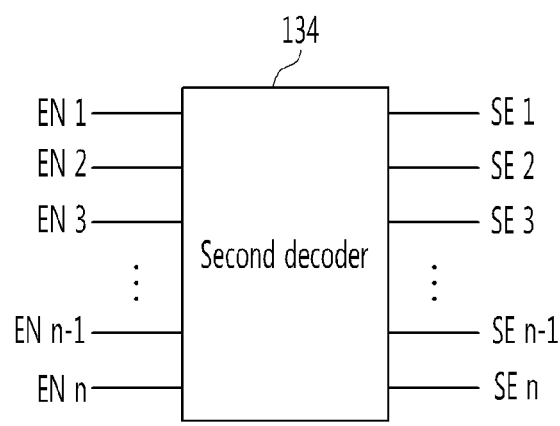
FIG. 6 is a detailed block diagram of a second decoder shown in FIG. 2.

FIG. 6 is a detailed block diagram of the second decoder 134 shown in FIG. 2.

Referring to FIG. 6, the second decoder 134 generates the first to $n^{th}$ selection signals SE1 to SEn by decoding the first to $n^{th}$ enable signals EN1 to ENn, respectively. When the second decoder 134 is activated, it generates only one of the first to $n^{th}$ selection signals SE1 to SEn in a high level and generates the remaining selection signals in a low level. More specifically, the second decoder 134 generates a high level corresponding to a last enable signal in a sequence of enabled signals, and generates the remaining selection signals in a low level. For example, when the first and the second enable signals EN1 and EN2 are in a high level and the third to $n^{th}$ enable signals EN3 to ENn are in a low level, the second decoder 134 generates only the second selection signal of a high level and generates the first and the third to $n^{th}$ selection signals SE1 and SE3 to SEn of a low level.

Figure 7:
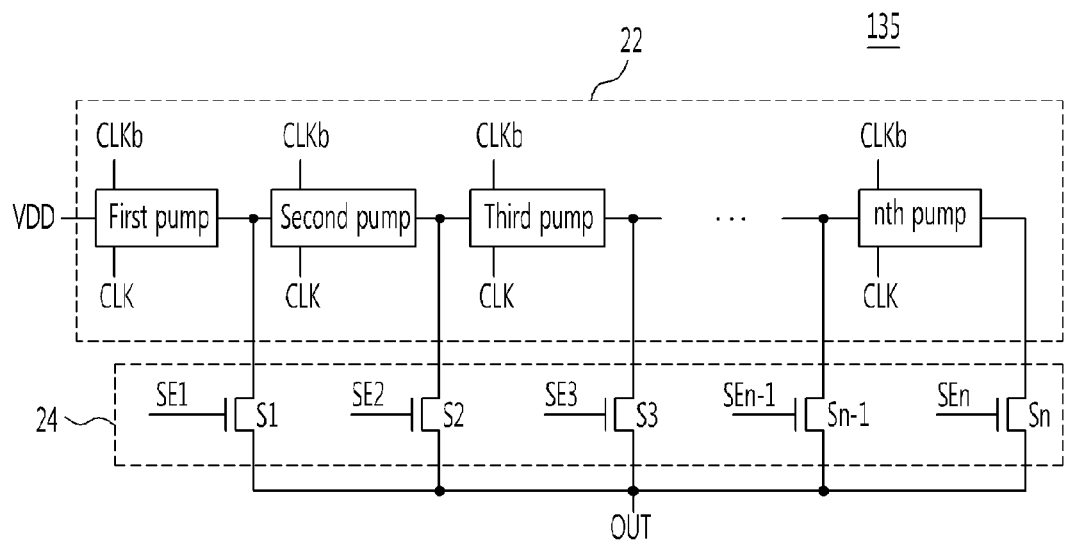
FIG. 7 is a detailed circuit diagram of a high voltage generator shown in FIG. 2.

FIG. 7 is a detailed circuit diagram of the high voltage generator 135 shown in FIG. 2.

Referring to FIG. 7, the high voltage generator 135 includes a pump circuit group 22 for performing a pumping operation in response to the clock signals CLK and CLKb. The pump circuit group 22 may also include a switch circuit 24 for generating voltage of the pump circuit group 22.

The pump circuit group 22 includes the first to $n^{th}$ pump circuits and the switch circuit 24 includes first to $n^{th}$ switch elements S1 to Sn. The number of each of the pump circuits and switch elements is equal to the number of the clock drivers D1 to Dn the oscillator 132. The high voltage generator is described in detail below.

The first to $n^{th}$ pump circuits of the pump circuit group 22 are coupled in series. Each of the first to $n^{th}$ pump circuits may be implemented using a pump, including one stage or a plurality of stages, or a pair of pumps. For example, the first pump circuit may be formed of one pump or two pumps. Here, the stage refers to a unit group, including a capacitor and a diode for raising voltage.

When a power supply voltage VDD is supplied to the input terminal of the first pump circuit, the first pump circuit raises the power supply voltage VDD by performing a pumping operation in response to the clock signals CLK and CLKb. As described above, the clock signal CLKb has an opposite phase as the clock signal CLK. The second pump circuit raises voltage outputted from the first pump circuit by performing a pumping operation in response to the clock signals CLK and CLKb. The third pump circuit raises voltage outputted from the second pump circuit by performing a pumping operation in response to the clock signals CLK and CLKb. The $n^{th}$ pump circuit raises voltage outputted from an $(n-1)^{th}$ pump circuit by performing a pumping operation in response to the clock signals CLK and CLKb. In this manner, each of the plurality of pump circuits raises the power supply voltage or voltage outputted from a previous pump circuit by performing the pumping operation in response to the clock signals and outputs the raised voltage. That is, the high voltage generator 135 uses an increased number of stages with an increase in the number of operated pump circuits and thus outputs voltage, raised in proportion to the number of operated pump circuits, to a common output terminal OUT.

The switch circuit 24 includes the plurality of switch elements S1 to Sn coupled between the common output terminal OUT and the output terminals of the respective pump circuits of the pump circuit group 22.

More particularly, the first switch element S1 is coupled between the common output terminal OUT and the output terminal of the first pump circuit and the first switch element S1 is operated in response to the first selection signal SE1. The second switch element S2 is coupled between the common output terminal OUT and the output terminal of the second pump circuit and the second switch element S2 is operated in response to the second selection signal SE2. The third switch element S3 is coupled between the common output terminal OUT and the output terminal of the third pump circuit and the third switch element S3 is operated in response to the third selection signal SE3. Likewise, the $n^{th}$ switch element Sn is coupled between the common output terminal OUT and the output terminal of the $n^{th}$ pump circuit and the $n^{th}$ switch element is operated in response to the $n^{th}$ selection signal SEn. The first to $n^{th}$ switch elements S1 to Sn are implemented using respective NMOS transistors operated in response to the first to $n^{th}$ selection signal SE1 to SEn supplied to the gates of the first to $n^{th}$ switch elements S1 to Sn.

Various examples of a method of operating the high voltage generator 135 are described below.

In the case where the output voltage of the first pump circuit is used, the first pump circuit of the high voltage generator 135 is operated, and the first switch element S1 is turned on. Here, the remaining second to $n^{th}$ pump circuits are not operated, and the remaining second to $n^{th}$ switch elements S2 to Sn are turned off. That is, only the first pump circuit is operated in response to the clock signals CLK and CLKb generated by only the first clock driver D1, and only the first switch element S1 is turned on in order to output voltage from the first pump circuit to the common output terminal OUT.

In the case where the output voltage of the third pump circuit is used, the first to third pump circuits of the high voltage generator 135 are operated, and the third switch element S3 is turned on. In this case, the remaining fourth to $n^{th}$ pump circuits are not operated, and the first and the second and the fourth to $n^{th}$ switch elements S1 and S2 and S4 to Sn are turned off. That is, only the first to third clock drivers D1 to D3 are activated to operate the first to third pump circuits, and only the third switch element S3 is turned on in order to output voltage from the third pump circuit to the common output terminal OUT. Accordingly, when the output voltage of the third pump circuit is used, voltages outputted from the first and the second pump circuits are prevented from being outputted to the common output terminal OUT, and only voltage outputted from the third pump circuit is outputted to the common output terminal OUT.

In the case where the output voltage of the $n^{th}$ pump circuit is used, all the first to $n^{th}$ pump circuits of the high voltage generator 135 are operated, but only the $n^{th}$ switch element Sn is turned on. In this case, the first to $(n-1)^{th}$ switch elements S1 to Sn-1 are turned off. That is, the first to $n^{th}$ clock drivers D1 to Dn are activated to operate the first to $n^{th}$ pump circuits, but only the $n^{th}$ switch element Sn is turned on in order to output voltage from the $n^{th}$ pump circuit to the common output terminal OUT. Accordingly, when voltage of the $n^{th}$ pump circuit is used, voltages outputted from the first to $(n-1)^{th}$ pump circuits are prevented from being outputted to the common output terminal OUT, but only voltage outputted from the $n^{th}$ pump circuit can be outputted to the common output terminal OUT.

Figure 8:
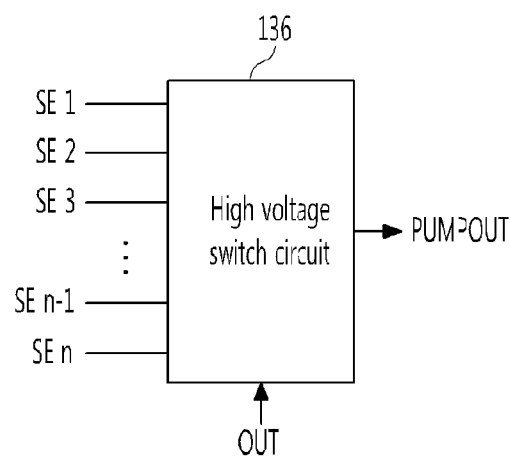
FIG. 8 is a detailed block diagram of a high voltage switch circuit shown in FIG. 2.

FIG. 8 is a detailed block diagram of the high voltage switch circuit 136 shown in FIG. 2.

Referring to FIG. 8, the high voltage switch circuit 136 outputs voltage, received from the common output terminal OUT, to the internal circuits as the high voltage PUMPOUT in response to the first to $n^{th}$ selection signals SE1 to SEn.

As described above, when voltage lower than the highest voltage that may be generated by the voltage generator is generated, the voltage generator does not operate all the pump circuits, but selectively operates only some pump circuit so that the clock signals are outputted. Accordingly, an unnecessary pumping operation can be prevented. Accordingly, unnecessary power consumption can be prevented.

According to the present disclosure, the plurality of pump circuits is used and the clock signals for driving the pump circuits are selectively outputted. Accordingly, a pumping operation for raising voltage level can be selectively operated.

Consequently, unnecessary current consumption when a low voltage is generated can be minimized.

What is claimed is:

1. A voltage generator, comprising:
a high voltage generator configured to include a plurality of pump circuits for generating various levels of a high voltage in response to clock signals, wherein the plurality of pump circuits are configured to receive enable signals corresponding to a level of voltage to be generated where the enable signals are generated in response to internal operation signals; and
a clock transfer circuit configured to generate a clock enable signal by comparing the high voltage and a reference voltage and to selectively provide the clock signals to each of the pump circuits in response to the clock enable signal and each of the enable signals,
wherein the clock transfer circuit comprises:
a comparator configured to generate the clock enable signal by comparing the reference voltage and the high voltage of the high voltage generator; and
a plurality of clock drivers operated in response to the clock enable signal and respective enable signals and configured to provide the clock signals to each of the pump circuits.

2. The voltage generator of claim 1, wherein the pump circuits are coupled in series and configured to generate different levels of voltages in response to the clock signals selectively provided thereto.

3. The voltage generator of claim 2, wherein each of the pump circuits generates a voltage higher than voltage generated by a previous pump circuit in response to the clock signals.

4. The voltage generator of claim 3, wherein a first pump circuit of the pump circuits generates voltage higher than a power supply voltage in response to the clock signals.

5. The voltage generator of claim 1, wherein:
each of the clock drivers is activated when both the clock enable signal and each of the enable signals are in a high level and configured to transfer the clock signals, and each of the clock drivers is deactivated when any one of the clock enable signals and each of the enable signals is in a low level.

6. The voltage generator of claim 5, wherein each of the clock drivers comprises:
a first switch for transferring one of the clock signals in response to each of the enable signals;
a second switch for outputting the one clock signal of the first switch in response to the clock enable signal;
a third switch for outputting the other of the clock signals, having an opposite phase to the one clock signal, in response to each of the enable signals; and
a fourth switch for outputting the other clock signal in response to the clock enable signal.

7. The voltage generator of claim 1, wherein the comparator functions as a regulator for outputting the clock enable signal of a low level when the high voltage is higher than the reference voltage.

8. The voltage generator of claim 1, further comprising an oscillator for generating the clock signals.

9. The voltage generator of claim 1, wherein each of the pump circuits is implemented using one pump or a pair of pumps.

10. The voltage generator of claim 9, wherein at least one pump of the plurality of pump circuits includes a stage or a plurality of stages.

11. The voltage generator of claim 10, wherein the stage is a unit group, including a capacitor and a diode for raising voltage.

12. A nonvolatile memory device, comprising:
an oscillator configured to generate clock signals;
a high voltage generator configured to include a plurality of pump circuits for generating various levels of a high voltage by performing pumping operations in response to clock signals;
a first decoder configured to generate enable signals for operating the number of pump circuits corresponding to a level of voltage to be generated, from among the pump circuits, in response to internal operation signals corresponding to a program, read or erase operation;
a clock transfer circuit configured to selectively provide the clock signals to each of the pump circuits in response to each of the enable signals;
a second decoder configured to generate selection signals in response to the respective enable signals; and
a high voltage switch circuit configured to transfer the high voltage of the high voltage generator to an internal circuit in response to the selection signals.

13. The nonvolatile memory device of claim 12, wherein the clock signals includes a clock and an inverse clock having an opposite phase to the clock.

14. The nonvolatile memory device of claim 12, wherein the pump circuits are coupled in series and configured to generate the various levels of the high voltage by performing the respective pumping operations when the clock signals are activated.

15. The nonvolatile memory device of claim 12, wherein the clock transfer circuit comprises:
a plurality of clock drivers operated in response to the respective enable signals and configured to provide the clock signals to the respective pump circuits; and
a comparator configured to output a clock enable signal to the clock drivers by comparing a reference voltage and the high voltage generated by the high voltage generator.

16. The nonvolatile memory device of claim 15, wherein:
each of the clock drivers is activated when both the clock enable signal and each of the enable signals are in a high level and configured to transfer the clock signals, and each of the clock drivers is deactivated when any one of the clock enable signals and each of the enable signals is in a low level.

17. The nonvolatile memory device of claim 12, wherein the high voltage switch circuit comprises a plurality of switch elements for transferring the high voltage of the high voltage generator to an internal circuit in response to the respective selection signals.

18. A voltage generator, comprising:
a first decoder configured to generate a plurality of enable signals, and activate a number of enable signals determined based on a set high voltage;
a clock transfer circuit configured to generate a same number of clock signals as the number of activated enable signals; and
a high voltage generator configured to comprise a plurality of pump circuits for generating various levels of a high voltage in response to the clock signals, wherein the number of pump circuits operated is identical with the number of clock signals generated by the clock transfer circuit.

19. The voltage generator of claim 18, wherein the clock transfer circuit comprises:
a comparator configured to generate a clock enable signal by comparing the high voltage and a reference voltage; and
a plurality of clock drivers operated in response to respective enable signals, wherein each of the clock drivers is operated in response to one respective clock enable signal and the activated enable signal.

20. The voltage generator of claim 18, further comprising:
a second decoder configured to generate selection signals in response to the enable signals and to activate only a selection signal corresponding to the activated enable signal, from among the enable signals; and
a high voltage switch circuit configured to transfer the high voltage of the high voltage generator to an internal circuit in response to the activated selection signal.

* * * * *